(12) United States Patent
Xu

(10) Patent No.: US 8,362,842 B1
(45) Date of Patent: Jan. 29, 2013

(54) CIRCUIT AND METHOD FOR DYNAMICALLY CONTROLLING OP-AMP OFFSET FOR PHOTODETECTOR APPLICATIONS

(75) Inventor: Gonggui Xu, Plano, TX (US)

(73) Assignee: Texas Advanced Optoelectronic Solutions, Inc., Plano, TX (US)

( * ) Notice: Subject to any disclaimer, the term of this patent is extended or adjusted under 35 U.S.C. 154(b) by 0 days.

(21) Appl. No.: 13/198,120

(22) Filed: Aug. 4, 2011

(51) Int. Cl.
*H03F 3/08* (2006.01)

(52) U.S. Cl. .................................. 330/308; 250/214 A

(58) Field of Classification Search .................. 330/308, 330/59; 250/214 A, 214 AG
See application file for complete search history.

(56) References Cited

U.S. PATENT DOCUMENTS 7,561,812 B2 * 7/2009 Tai et al. ........................ 398/202
8,040,180 B2 * 10/2011 Yen et al. ........................ 330/10

* cited by examiner

*Primary Examiner* — Hieu Nguyen
(74) *Attorney, Agent, or Firm* — Howison & Arnott, L.L.P.

(57) ABSTRACT

Provided herein are a circuit and method for dynamically controlling operational amplifier (op-amp) offset for photodetector applications using a variable trimming circuit coupled to a test node and an op-amp.

20 Claims, 2 Drawing Sheets

US 8,362,842 B1

CIRCUIT AND METHOD FOR DYNAMICALLY CONTROLLING OP-AMP OFFSET FOR PHOTODETECTOR APPLICATIONS

BACKGROUND

Integrated circuits (ICs) may include various components for use in applications such as optical sensing applications. One such component is an operational amplifier (op-amp) that has positive and negative input terminals. An ideal op-amp has no input offset voltage. In other words, the positive and negative input terminals are balanced so that connecting the two terminals to one another results in a zero output. Practically however, a finite offset exists due to imperfections in the op-amp itself and/or environmental factors such as heat that may affect op-amp performance. This offset may affect the performance of an optical sensing application. Accordingly, improvements are needed to address op-amp offset in optical sensing applications.

BRIEF DESCRIPTION OF THE DRAWINGS

For a more complete understanding, reference is now made to the following description taken in conjunction with the accompanying Drawings in which.

DETAILED DESCRIPTION

Figure 1:
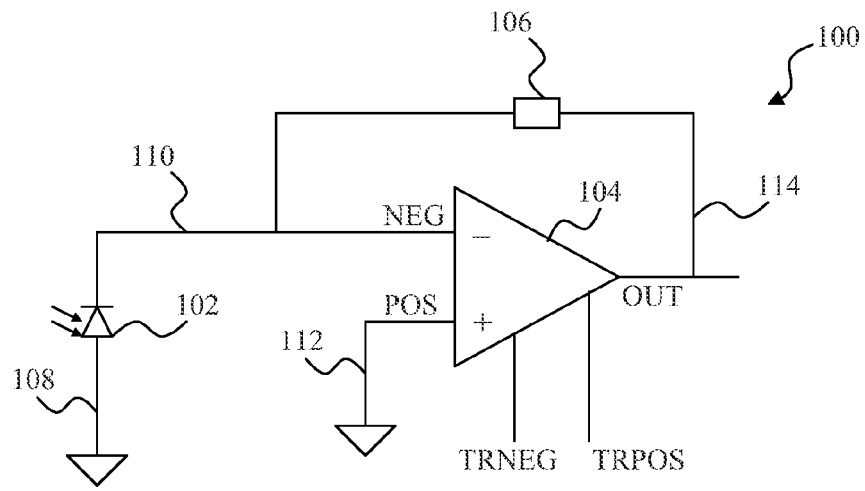
FIG. 1 illustrates one embodiment of a circuit having an op-amp coupled to an optoelectronic sensor.

The present disclosure is directed to circuits and methods for op-amp offset control. It is understood that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, one embodiment of a circuit 100 is illustrated with an optoelectronic sensor 102 (e.g., a photodiode) that produces a current in response to detected light. The photodiode 102 is coupled to an op-amp 104. The circuit 100 is a simplified circuit and it is understood that the photodiode 102 may be coupled to the op-amp 104 in many different configurations. Furthermore, while the circuit 100 includes an element 106 (e.g., a capacitor or a resistor), it is understood that the circuit 100 may include many different components, including resistive elements, capacitive elements, inductive elements, other op-amps, and/or other components needed to provide desired functionality.

The op-amp 104 includes a negative input terminal NEG, a positive input terminal POS, and an output terminal OUT. In the present example, the anode of the photodiode 102 is coupled to ground via a node 108 and the cathode of the photodiode 102 is coupled to the negative input terminal NEG of the op-amp 104 via a node 110. The positive input terminal 110 is coupled to ground via a node 112. The output terminal OUT is coupled to a node 114, which is coupled to the node 110 via the element 106.

The photodiode 102 of circuit 100 is a light sensor: a photo current will be produced from the photodiode 102 when light hits the photodiode. At low light, the generated photo current might be very small. In order to detect low light, the photodiode 102 is preferred to have an extremely low leakage current. One way to reduce photodiode leakage current is to make sure the voltage across the photodiode is close to zero. This can be achieved by a high gain op-amp 104. For the ideal op-amp with no input offset, the feedback configuration of the circuit 100 will drive the op-amp NEG input terminal very close to the POS input terminal. When the POS input terminal is at ground voltage level, the NEG input terminal will also be close to ground voltage level. Since the photodiode 102 is between the NEG input terminal and ground, the voltage across the photodiode 102 is close to zero voltage, and therefore an extremely low leakage current (also called dark current) can be achieved.

Although an ideal op-amp has no offset voltage, in the real world the op-amp 104 of the circuit 100 has a finite offset. In photodetector applications (e.g., ambient light sensing, motion detection, or proximity detection), this offset is undesirable because this offset voltage is the voltage across the photodiode 102. When the photodiode 102 is biased up by this offset voltage, a finite amount of leakage current (also called dark current) will be generated from the photodiode 102 and this will limit the photodetector's performance. For example, the dark current may result in a detectable signal even when the photodiode 102 is not actually detecting light. For photodetector applications, this is problematic as it may interfere with sensing applications that rely on extremely low levels of detected light. Accordingly, the offset voltage needs to be minimized or eliminated in order to more accurately detect light using the photodiode 102.

Due to the offset voltage that may exist between the positive and negative input terminals POS and NEG of the op-amp 104, the op-amp 104 also includes a negative trim terminal TRNEG and a positive trim terminal TRPOS that may be used to bias the op-amp 104 either negatively or positively, respectively, to account for offset. Adjusting for this offset is referred to as "trimming" and typically involves the use of a trimming current that compensates for the mismatches between differential branches within the op-amp 104 and serves to minimize or cancel the offset when applied. However, offset trimming may be difficult to accomplish if the offset is so small as to be difficult to detect. Furthermore, trimming may be performed for a certain set of parameters (e.g., a particular environmental temperature or range of temperatures) and may change if the circuit 100 is used under other environmental conditions.

Trimming introduces an additional problem that involves reliability. More specifically, there is a question as to whether the trimming circuit itself is reliable. For example, if a desired current is to be supplied to the TRNEG terminal of the op-amp 104, the trimming circuit may be set to provide that current. However, there may be no testing of the trimming circuit to ensure that it is actually providing the desired current.

Figure 2:
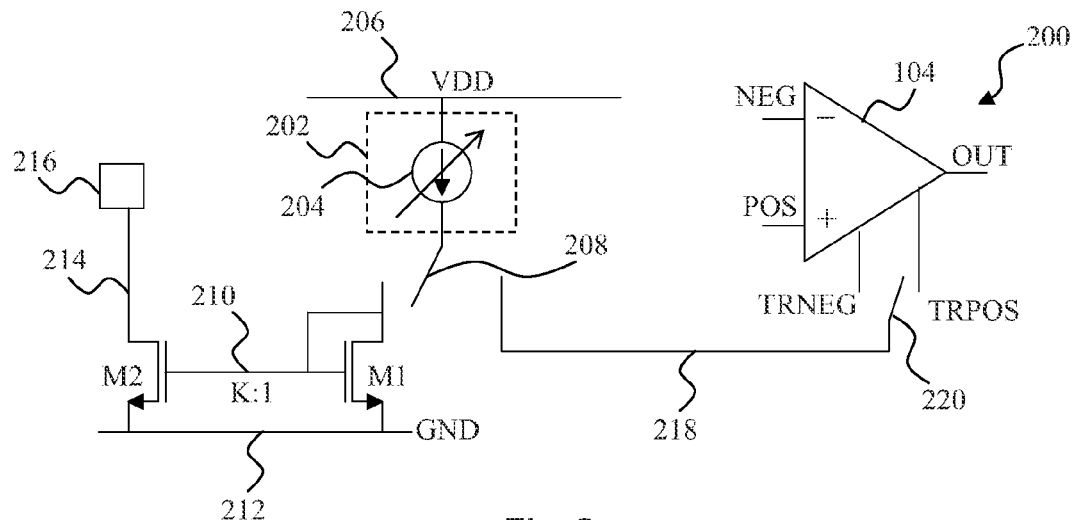
FIG. 2 illustrates one embodiment of a circuit having a variable trimming circuit coupled to a test node and the op-amp of FIG. 1.

Referring to FIG. 2, one embodiment of a circuit 200 is illustrated with the op-amp 104 of FIG. 1. Although not shown, the op-amp 104 may be part of the circuit of FIG. 1 or may be configured differently. The circuit 200 also includes a variable trimming circuit 202 that controls current for two different purposes. One purpose is to provide trimming circuitry for providing a trimming current to the op-amp 104 and another purpose is to provide a test current to ensure that the trimming current is correct (e.g., that the variable trimming circuit 202 is functioning correctly). For purposes of illustration, the variable trimming circuit 202 is shown with a variable current source 204. The variable current source 204 is coupled to a VDD node 206 and provides current to a selector 208, which represents any means for selectively diverting current. The selector 208 is coupled to an output of the variable current source 204 and the position of the selector 208 results in the output current being either the test current or the trimming current.

In other embodiments, the selector 208 may be configured to provide current from selected current branches (as described below) as the trimming current and the remaining current as the test current. This configuration enables the difference between the total current and the trimming current to be calculated to determine whether the trimming current is correct without affecting the supply of the trimming current to the op-amp 104. In still other embodiments, each current branch or group of current branches may be selectable to couple to either a test node or a trim node, and the selector 208 may be omitted.

To provide the test current, the selector 208 may be manipulated to provide current to a current amplifier. In the present example, the current amplifier is a current mirror formed by transistors M2 and M1 that provides a gain of K:1, but it is understood that other current amplifiers may be used. For purposes of illustration, the transistors M1 and M2 are both N-channel metal oxide semiconductor field effect transistors (MOSFET), but it is understood that other transistors and transistor configurations may be used. The gates of M1 and M2 are coupled together to form a node 210 and the sources of both M1 and M2 are coupled to a ground node 212. The selector 208 is coupled to the drain of M1 and to the node 210. The drain of M2 is coupled to a test pin 216 by a node 214.

To provide the trimming current polarity, the selector 208 may be manipulated to provide current to a switch 220 via a node 218. The switch 220 represents any means for selectively diverting current received from the variable current source 206 to one of TRNEG and TRPOS.

Figure 3:
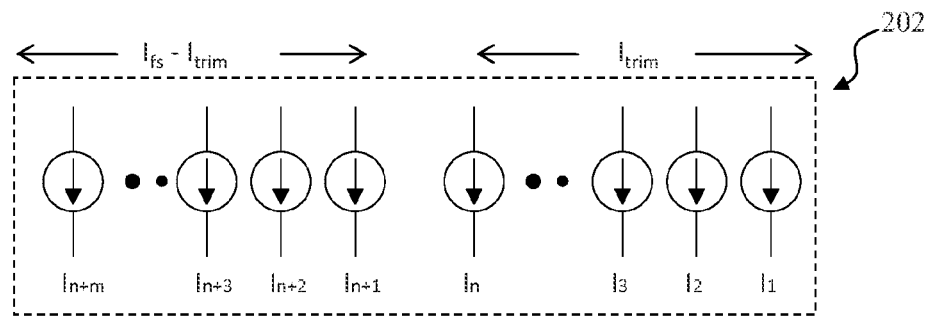
FIG. 3 illustrates one embodiment of the variable trimming circuit of FIG. 2.

With additional reference to FIG. 3, one embodiment of the variable trimming circuit 202 is illustrated as a current source having multiple current branches identified as $I_1$ through $I_{n+m}$. Each current branch $I_1$ through $I_{n+m}$ may be individually selectable and the variable trimming circuit 202 may be configured to provide varying amounts of current based on the selected branches with a total available current of $I_{fullscale}$ ($I_{fs}$) that is the sum of all the branches.

As described previously, some embodiments may enable the current branches $I_1$ through $I_{n+m}$ to be individually selectable, which enables testing of branches not used for trimming to occur simultaneously with trimming. For example, current branches $I_1$ through $I_n$ may be selected for the trimming current ($I_{trim}$) and the remainder ($I_{n+1}$ through $I_{n+m}$) may be available for a testing current ($I_{fs}-I_{trim}$).

It is understood that many different configurations of current branches $I_1$ through $I_{n+m}$ may be provided. For example, the current branches may be configured to supply an identical amount of current or different amounts of current. One possible configuration is a binary configuration where $I_1$ is the smallest current branch (where "smallest" refers to the amount of current provided and provides the minimum resolution of the variable trimming circuit 202) and is configured to provide an amperage of X, $I_2$ is configured to provide twice as much current as $I_1$ (2*X), $I_3$ is configured to provide twice as much current as $I_2$ ($2^2$*X), and so on until $I_{n+m}$ ($2^{n+m-1}$*X). In another possible configuration, each current branch is identical and a sufficient number of current branches are summed until the desired current is obtained. In yet another possible configuration, each current branch other than $I_1$ and $I_2$ may be the summation of previous current branches. For example, $I_3$ may be the summation of $I_1$ and $I_2$, $I_4$ may be the summation of $I_3$, $I_2$, and $I_1$, and so on. Accordingly, the actual configuration of the circuit branches $I_1$ through $I_{n+m}$ may vary considerably as long as the value of each is known so that the proper current branches can be selected to provide the desired trimming current.

Figure 4:
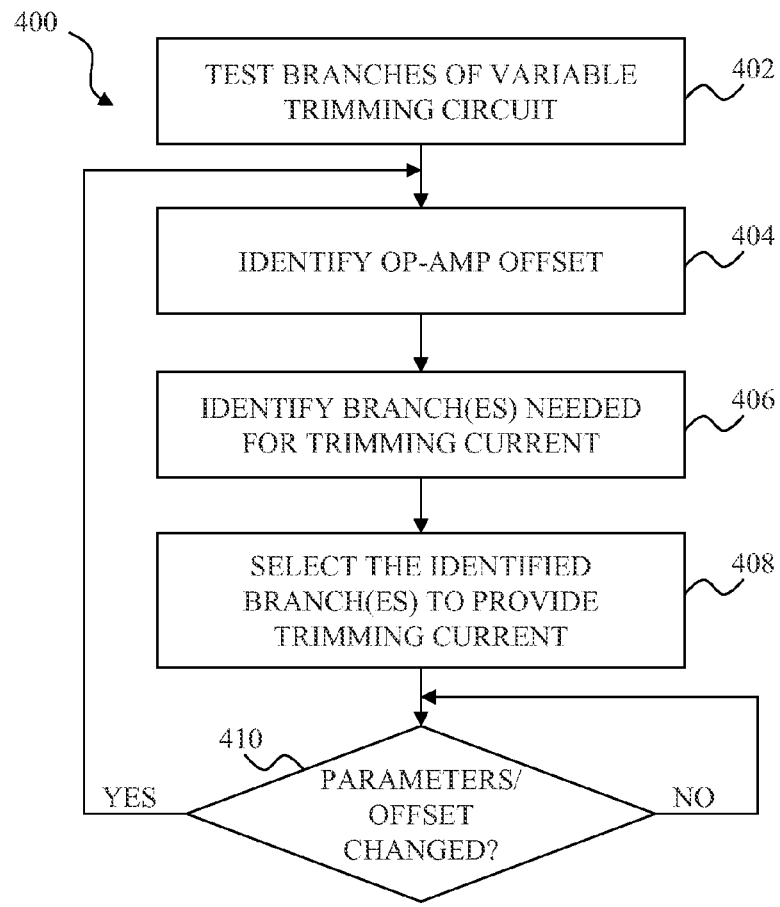
FIG. 4 is a flow chart illustrating one embodiment of a method that may be used with the circuit of FIG. 2.

Referring to FIG. 4, a method 400 illustrates one embodiment of a process that may be executed using the circuit 200 of FIG. 2 with the variable trimming circuit 202 as illustrated in FIG. 3. The method 400 is a multi-step process that involves both testing the variable trimming circuit 202 and trimming the offset of the op-amp 104.

In step 402, each circuit branch is tested individually to ensure that each branch is functioning properly. This step involves directing the output of the variable trimming circuit 202 to the test pin 216 and measuring the current off of the test pin 216. Various methods may be used to test the current branches. For example, each current branch may be stepped through on an individual basis, with $I_1$ being tested, then $I_2$, then $I_3$, etc, to determine whether each branch provides the proper current. Alternatively, calculations may be performed based on multiple branches. For example, $I_1$ may be tested and then $I_1+I_2$ may be tested. The difference may be calculated as the value of $I_2$, or the summed result may be compared to a desired value. Accordingly, while the actual testing process may vary, a determination is made as to whether each current branch is functioning properly.

Although not shown in FIG. 4, if a current branch is not functioning properly, the variable trimming circuit 202 may be discarded (which may entail discarding some or all of the remainder of the circuit 200). Alternatively, adjustments may be made. For example, if the branch $I_3$ is not functioning and the current branches are identical, $I_3$ may be marked as malfunctioning and the number of available current branches may be reduced to $I_{n+m-1}$. It is understood that this may be performed in software and so may entail the circuit 200 being coupled to a processor with which it will be used as the processor would need to know which current branch is not functioning. Due to the more complicated nature of such adjustments, discarding of the variable trimming circuit 202 may be the typical method of handling a malfunctioning current branch, particularly when the testing of step 402 is performed during manufacture.

In step 404, the offset of the op-amp 104 is identified. This step may involve coupling the input pins of the op-amp together (e.g., via ground), directing the output of the variable trimming circuit 202 to the op-amp 104, and measuring the output of the op-amp 104 while stepping through the current branches. As the op-amp 104 theoretically has infinite gain, the testing process may look for the lowest value current branch or branch combination that causes the output of the op-amp 104 to transition from positive to negative or vice versa. It is understood that any method may be used to determine the offset of the op-amp 104 using the variable trimming circuit 202. For example, the current branches may be stepped through in order from smallest to largest, from largest to smallest, or in other methodologies, such as using larger step increments to more rapidly narrow the offset into a smaller range of possibilities and then using smaller current branches to more carefully identify the offset.

In step 408, the current branches needed to produce the desired trimming current are selected. This may be accomplished by configuring the variable trimming circuit 202 to close the desired current branches and open the remaining current branches. For example, if $I_1$, $I_2$, and $I_5$ are needed, those three current branches may be closed and the remaining branches opened. In the embodiments providing for both testing and trimming currents, this would result in an $I_{trim}$ equal to $I_{1+2+5}$ and an $I_{fs}-I_{trim}$ of $I_{n+m}-(I_{1+2+5})$.

In step 410, a determination may be made as to whether parameters and/or the offset have changed. For example, the offset may drift over time or parameters changes (e.g., moving from one environmental temperature to another environmental temperature) may cause offset changes. If the parameters/offset have changed, the method 400 returns to step 404. If the parameters/offset have not changed, the method 400 may return to step 410.

It is understood that step 410 may occur some time after the preceding steps. For example, steps 402-408 may be performed initially during manufacture, while a user may execute step 410 at a later time to determine whether the offset needs to be corrected. As the variable trimming circuit 202 has been fully tested in step 402, a later adjustment to the trimming current that uses current branches not originally used will provide the proper trimming current. Without such complete testing of the variable trimming circuit 202, later adjustments may rely on malfunctioning current branches and so would not produce the proper trimming current. Accordingly, it is understood that the method 400 may end and later be restarted at a particular step (e.g., step 410 or 404) or that a relatively long period of time may elapse before step 410 is executed.

Although not shown, in some embodiments the variable trimming circuit 202 may be retested as well. Such functionality may be available or may be hidden based on packaging, available interfaces (e.g., whether the test node is accessible), and/or other factors.

Figure 5:
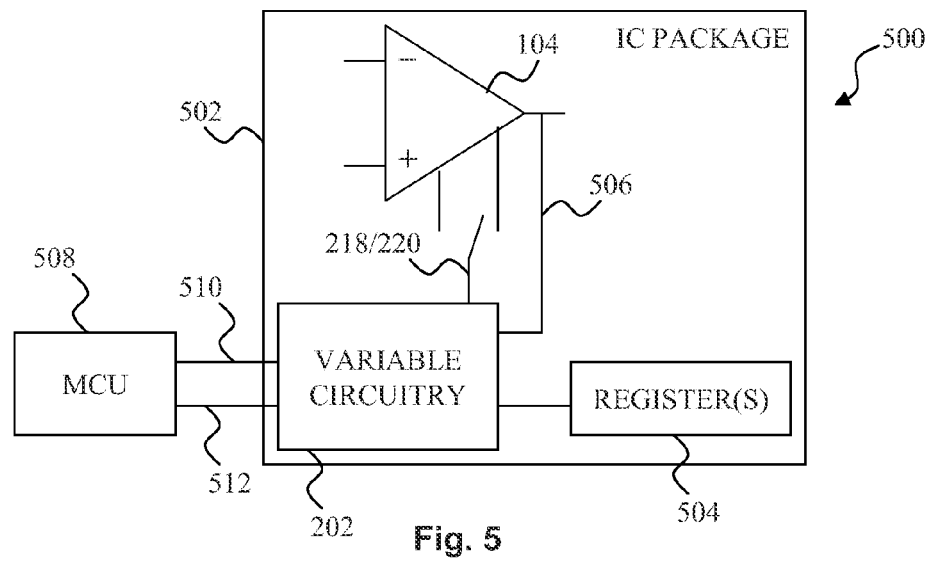
FIG. 5 is a diagram of one embodiment of a system with which the circuit of FIG. 2 may be used.

Referring to FIG. 5, one embodiment of a system 500 within which the circuit 200 of FIG. 2 may be used is provided. The system 500 includes an integrated circuit (IC) package 502 that provides, in the present example, ALS functionality, although the IC package may be configured to provide any optical sensing functionality. The IC package 502 includes the circuit 200, although not all components are shown (e.g., the photodiode 102 of FIG. 1). For example, the op-amp 104 and the variable trimming circuit 202 are illustrated along with one or more registers 504 that are coupled to the variable trimming circuit 202. The registers 504 may be used to store configuration variables for the variable trimming circuit 202, such as which current branches are to be used for trimming the op-amp 104. A feedback loop 506 may be provided to aid in identifying the offset during testing. It is understood that packaging material (e.g., a plastic) may encapsulate some or all of the IC package 502, although pins and the photodiode 102 may be mounted above or otherwise not covered by the packaging material.

The system 500 may further include a microcontroller unit (MCU) 508 or other processer that is coupled to the IC package 502. In the present example, the MCU 508 is coupled to the variable control circuitry 202 via lines 510 and 512, which may be clock and data lines respectively. In other embodiments, the MCU 508 may be coupled directly to the registers 504.

In operation, a user may interact with the MCU 508 to test the offset of the op-amp 104, set a new trimming current via the variable trimming circuitry 202, and/or otherwise configure and use the functionality provided by the IC package 502.

It will be appreciated by those skilled in the art having the benefit of this disclosure that this circuit and method for dynamically controlling op-amp offset for photodetector applications provides improved functionality. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A circuit for controlling op-amp offset in a photodetector application comprising:
  a photodetector configured to produce a current in response to detecting light;
  an op-amp having an output terminal, a positive trim terminal, a negative trim terminal, and first and second input terminals, wherein at least one of the first and second input terminals is coupled to the photodetector and wherein an output produced at the output terminal of the op-amp when operational is based on the current produced by the photodetector;
  a variable trimming circuit configured to receive a current I, wherein the variable trimming circuit includes a plurality of current branches each configured to provide a portion of the current I to an output node of the variable trimming circuit;
  a test node; and
  a selector having an input portion coupled to the output node and an output portion that can be coupled to both the test node and a transmission node, wherein the transmission node is configured to couple to one of the positive and negative trim terminals, and wherein the selector is configurable to direct current received from the output node to one of the test node and the transmission node.

2. The circuit of claim 1 further comprising a current amplifier positioned between the output portion of the selector and the test node.

3. The circuit of claim 1 wherein at least one of the plurality of current branches is configured to provide a variable amount of current.

4. The circuit of claim 1 wherein the plurality of current branches are configured in a binary arrangement.

5. The circuit of claim 1 wherein a current branch that is configured to provide the smallest current of the plurality of current branches defines a resolution of a trimming current that can be provided to the transmission node.

6. The circuit of claim 1 further comprising a packaging material covering the op-amp, variable trimming circuit, test node, transmission node, and selector, wherein the test node is accessible only before the application of the packaging material.

7. The circuit of claim 1 further comprising a packaging material covering the op-amp, variable trimming circuit, test node, transmission node, and selector, wherein the test node is accessible after the application of the packaging material.

8. The circuit of claim 1 further comprising:
  a register coupled to the variable trimming circuit; and
  at least one input terminal coupled to the variable trimming circuit, wherein the input terminal is configured to carry configuration parameters to the variable trimming circuit that can be stored in the register for the plurality of current branches.

9. The circuit of claim 8 wherein a feedback loop couples the output terminal of the op-amp to the variable trimming circuit.

10. An integrated circuit package for an optical sensing application comprising:
a photodetector configured to produce a current in response to detecting light;
an op-amp having an output terminal, a positive trim terminal, a negative trim terminal, and first and second input terminals, wherein at least one of the first and second input terminals is coupled to the photodetector and wherein an output produced at the output terminal of the op-amp is based on the current produced by the photodetector;
a variable trimming circuit configured to receive a current I, wherein the variable trimming circuit includes a plurality of current branches each configured to provide a portion of the current I to an output node of the variable trimming circuit;
a selector having an input portion coupled to the output node and an output portion that can be coupled to both a test node and a transmission node, wherein the transmission node is configured to couple to one of the positive and negative trim terminals, and wherein the selector is configurable to direct current received from the output node to one of the test node and the transmission node; and
a packaging material covering the op-amp, variable trimming circuit, transmission node, and selector.

11. The integrated circuit package of claim 10 further comprising:
a register coupled to the variable trimming circuit; and
at least one input terminal coupled to the variable trimming circuit, wherein the input terminal is configured to carry configuration parameters to the variable trimming circuit that can be stored in the register for the plurality of current branches.

12. The integrated circuit package of claim 11 wherein the packaging material further covers the test node.

13. The integrated circuit package of claim 12 wherein the test node is accessible via the at least one input terminal.

14. A method comprising:
testing a plurality of current branches in a variable trimming circuit to determine whether each of the current branches is capable of transmitting a defined amount of current, wherein each current branch provides a fraction of a total current I received by the variable trimming circuit to an output node of the variable trimming circuit;
identifying an offset value for an operational amplifier (op-amp) that receives an input signal from a photodetector, wherein the offset value causes an output level of the op-amp when no signal is being received from the photodetector;
identifying at least one of the current branches needed to provide a trimming current to the output node, wherein the trimming current is selected to minimize the offset value; and
selecting the at least one identified current branch to provide the trimming current to the op-amp.

15. The method of claim 14 further comprising selecting the trimming current as the closest match to the offset value that can be produced by the variable trimming circuit.

16. The method of claim 14 wherein testing the plurality of current branches includes:
selecting a single one of the plurality of current branches;
providing current to the selected single current branch; and
identifying whether an output current provided by the variable trimming circuit matches the fraction of the total current I to be provided by that current branch.

17. The method of claim 14 wherein testing the plurality of current branches includes:
selecting a plurality of current branches;
providing current to the selected plurality of current branches; and
identifying whether an output current provided by the variable trimming circuit matches the fraction of the total current I to be provided by the selected plurality of current branches.

18. The method of claim 14 further comprising:
identifying a second offset value for the op-amp;
identifying at least one of the current branches needed to provide a second trimming current to the output node, wherein the second trimming current is the closest match to the second offset value that can be produced by the variable trimming circuit; and
selecting the at least one identified current branch to provide the second trimming current to the op-amp.

19. The method of claim 18 wherein the steps of identifying, identifying, and selecting are repeated each time a new offset value is needed.

20. The method of claim 18 further comprising retesting the plurality of current branches prior to identifying at least one of the current branches needed to provide the second trimming current to the output node.

* * * * *